(12) United States Patent
Ma (10) Patent No.: US 10,490,150 B2
(45) Date of Patent: Nov. 26, 2019

(54) SHIFT REGISTER AND DRIVE METHOD THEREOF, GATE DRIVE DEVICE AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/759,420

(22) PCT Filed: Sep. 4, 2017

(86) PCT No.: PCT/CN2017/100381
§ 371 (c)(1),
(2) Date: Mar. 12, 2018

(87) PCT Pub. No.: WO2018/157572
PCT Pub. Date: Sep. 7, 2018

(65) Prior Publication Data
US 2019/0130857 A1  May 2, 2019

(30) Foreign Application Priority Data
Mar. 2, 2017 (CN) .......................... 2017 1 0119688

(51) Int. Cl.
*G09G 3/20* (2006.01)
*G09G 3/36* (2006.01)
*G11C 19/28* (2006.01)

(52) U.S. Cl.
CPC ............. *G09G 3/3677* (2013.01); *G09G 3/20* (2013.01); *G11C 19/28* (2013.01);
(Continued)

(58) Field of Classification Search
CPC ... G09G 2310/0267; G09G 2310/0281; G09G 2310/0286; G09G 2310/0294;
(Continued)

(56) References Cited

U.S. PATENT DOCUMENTS

2006/0192729 A1\* 8/2006 Cantatore ............ G09G 3/3677
345/55
2012/0081409 A1   4/2012 Chung
(Continued)

FOREIGN PATENT DOCUMENTS

CN    104766586 A    7/2015
CN    105185290 A    12/2015
(Continued)

OTHER PUBLICATIONS

PCT International Search Report, Application No. PCT/CN2017/100381, dated Nov. 29, 2017, 9 pages.: with English translation.
(Continued)

*Primary Examiner* — Tony O Davis
(74) *Attorney, Agent, or Firm* — Armstrong Teasdale LLP (57) ABSTRACT

A shift register includes an input circuit configured to control a voltage of a first and second node, a hold circuit configured to hold the voltage of the first and second nodes as well as an output voltage of the first and second output circuits, an output selection circuit configured to select the first and second outputs to output a scanning signal, a first output circuit configured to output a first output signal from a first output terminal based on the voltage of the first and third nodes, a second output circuit is configured to output a second output signal from a second output terminal based on the voltage of the first and fourth nodes, and a third output circuit configured to output a third output signal from a third output terminal based on a second clock signal and the voltage of the second node.

20 Claims, 5 Drawing Sheets

(52) U.S. Cl.
CPC ............... *G09G 2310/0267* (2013.01); *G09G 2310/0281* (2013.01); *G09G 2310/0286* (2013.01); *G09G 2310/0294* (2013.01); *G09G 2310/08* (2013.01); *G09G 2380/02* (2013.01)

(58) Field of Classification Search
CPC .. G09G 2310/08; G09G 2380/02; G09G 3/20; G09G 3/3677; G11C 19/28
USPC ..................................................... 345/55, 211
See application file for complete search history.

(56) References Cited

U.S. PATENT DOCUMENTS

| | | | | |
|---|---|---|---|---|
| 2013/0093743 A1* | 4/2013 | Takahashi | ............ | G09G 3/3677 345/211 |
| 2017/0193888 A1* | 7/2017 | Moon | ...................... | G09G 3/20 |
| 2018/0075800 A1* | 3/2018 | Ma | ....................... | G09G 3/3225 |
| 2018/0088654 A1* | 3/2018 | Liu | ....................... | G06F 1/3218 |
| 2018/0190173 A1* | 7/2018 | Feng | ......................... | G09G 3/20 |
| 2018/0190364 A1* | 7/2018 | Gu | ......................... | G11C 19/184 |
| 2018/0226132 A1* | 8/2018 | Gao | ........................ | G09G 3/3677 |
| 2018/0286342 A1* | 10/2018 | Li | ......................... | G09G 3/3677 |
| 2018/0336957 A1* | 11/2018 | Mi | ............................ | G09G 3/20 |
| 2019/0057638 A1* | 2/2019 | Kim | ......................... | G09G 3/20 |

FOREIGN PATENT DOCUMENTS

| | | |
|---|---|---|
| CN | 105845097 A | 8/2016 |
| CN | 105976759 A | 9/2016 |
| CN | 106409259 A | 2/2017 |
| CN | 106782284 A | 5/2017 |

OTHER PUBLICATIONS

PCT Written Opinion, Application No. PCT/CN2017/100381, dated Nov. 29, 2017, 11 pages.: with English translation.
China First Office Action, Application No. 201710119688.9, dated Dec. 5, 2017, 11 pps.: with English translation.

* cited by examiner

SHIFT REGISTER AND DRIVE METHOD THEREOF, GATE DRIVE DEVICE AND DISPLAY DEVICE

CROSS REFERENCE TO RELATED APPLICATIONS

This patent application is a National Stage Entry of PCT/CN2017/100381 filed on Sep. 4, 2017, which claims the benefit and priority of Chinese Patent Application No. 201710119688.9 filed on Mar. 2, 2017, the disclosures of which are incorporated herein by reference in their entirety as part of the present application.

BACKGROUND

The present disclosure relates to the field of display technologies, and more particularly to a shift register applicable to a foldable display and a drive method thereof, a gate drive device, an array substrate, and a display device.

A liquid crystal display (LCD) panel is composed of vertical and horizontal array pixel matrices. In a display process, a gate scanning signal is outputted by a gate drive device, and each pixel unit is scanned line by line. Gate driver on Array (GOA) is a technology for integrating a shift register onto an array substrate. As a shift register unit, each GOA unit sequentially transfers a scanning signal to a next GOA unit to turn on switching transistors in the pixel units row by row so as to input data signals for the pixel units. With the development of display technologies, foldable displays are increasingly popular. Shift registers applicable to the foldable displays and drive methods thereof are developed.

BRIEF DESCRIPTION

Embodiments set forth herein provide a shift register applicable to a foldable display and a drive method thereof, a gate drive device, an array substrate and a display device, which can control delay of an output signal in a better way, and thus are more advantageous to drive the foldable display.

A first aspect of the present disclosure provides a shift register. The shift register includes an input circuit, a hold circuit, an output selection circuit, a first output circuit, a second output circuit, and a third output circuit. The input circuit is configured to control a voltage of a first node and a voltage of a second node based on a start signal from an input terminal, a first clock signal from a first clock signal terminal, and a first voltage from a first voltage terminal. The hold circuit is configured to hold the voltage of the first node and the voltage of the second node as well as an output signal of the first output circuit and an output signal of the second output circuit. The output selection circuit is configured to select the first output circuit and/or the second output circuit to output a scanning signal, and control a voltage of a third node and/or a voltage of a fourth node based on the voltage of the second node. The first output circuit is configured to output a first output signal from a first output terminal based on the voltage of the first node and the voltage of the third node. The second output circuit is configured to output a second output signal from a second output terminal based on the voltage of the first node and the voltage of the fourth node. The third output circuit is configured to output a third output signal from a third output terminal based on a second clock signal and the voltage of the second node.

In embodiments of the present disclosure, the input circuit includes a first transistor, a second transistor, and a third transistor. A control electrode of the first transistor is coupled to the first clock signal terminal, a first electrode of the first transistor is coupled to the input terminal, and a second electrode of the first transistor is coupled to the second node. A control electrode of the second transistor is coupled to the first clock signal terminal, a first electrode of the second transistor is coupled to the first voltage terminal, and a second electrode of the second transistor is coupled to the first node. A control electrode of the third transistor is coupled to the second node, a first electrode of the third transistor is coupled to the first clock signal terminal, and a second electrode of the third transistor is coupled to the first node.

In embodiments of the present disclosure, the hold circuit includes a first capacitor, a second capacitor, a third capacitor, a fourth transistor, and a fifth transistor. A first terminal of the first capacitor is coupled to the first node, and a second terminal of the first capacitor is coupled to a second voltage terminal. A first terminal of the second capacitor is coupled to the second node, and a second terminal of the second capacitor is coupled to the first output terminal. A first terminal of the third capacitor is coupled to the second node, and a second terminal of the third capacitor is coupled to the second output terminal. A control electrode of the fourth transistor is coupled to the first node, a first electrode of the fourth transistor is coupled to the second voltage terminal, and a second electrode of the fourth transistor is coupled to a first electrode of the fifth transistor. A control electrode of the fifth transistor is coupled to a second clock signal terminal, and a second electrode of the fifth transistor is coupled to the second node.

In embodiments of the present disclosure, the output selection circuit includes a sixth transistor, a seventh transistor, an eighth transistor, and a ninth transistor. A control electrode of the sixth transistor is coupled to a first selection signal, a first electrode of the sixth transistor is coupled to the second node, and a second electrode of the sixth transistor is coupled to the third node. A control electrode of the seventh transistor is coupled to a second selection signal, a first electrode of the seventh transistor is coupled to the second voltage terminal, and a second electrode of the seventh transistor is coupled to the third node. A control electrode of the eighth transistor is coupled to a third selection signal, a first electrode of the eighth transistor is coupled to the second node, and a second electrode of the eighth transistor is coupled to the fourth node. A control electrode of the ninth transistor is coupled to a fourth selection signal, a first electrode of the ninth transistor is coupled to the second voltage terminal, and a second electrode of the ninth transistor is coupled to the fourth node.

In embodiments of the present disclosure, the first output circuit includes a tenth transistor and an eleventh transistor. A control electrode of the tenth transistor is coupled to the first node, a first electrode of the tenth transistor is coupled to the second voltage terminal, and a second electrode of the tenth transistor is coupled to the first output terminal. A control electrode of the eleventh transistor is coupled to the third node, a first electrode of the eleventh transistor is coupled to a second clock signal terminal, and a second electrode of the eleventh transistor is coupled to the first output terminal.

In embodiments of the present disclosure, the second output circuit includes a twelfth transistor and a thirteenth transistor. A control electrode of the twelfth transistor is coupled to the first node, a first electrode of the twelfth transistor is coupled to the second voltage terminal, and a second electrode of the twelfth transistor is coupled to the second output terminal. A control electrode of the thirteenth transistor is coupled to the fourth node, a first electrode of the thirteenth transistor is coupled to a second clock signal terminal, and a second electrode of the thirteenth transistor is coupled to the second output terminal.

In embodiments of the present disclosure, the third output circuit includes a fourteenth transistor and a fifteenth transistor. A control electrode of the fourteenth transistor is coupled to a second clock signal terminal, a first electrode of the fourteenth transistor is coupled to the second node, and a second electrode of the fourteenth transistor is coupled to the third output terminal. A control electrode of the fifteenth transistor is coupled to the second node, a first electrode of the fifteenth transistor is coupled to the second clock signal terminal, and a second electrode of the fifteenth transistor is coupled to the third output terminal.

In embodiments of the present disclosure, a duty ratio of the first clock signal is greater than 1/2, and a phase difference between the second clock signal and the first clock signal is equal to half of a cycle.

A second aspect of the present disclosure provides a drive method for driving the above shift register. According to the drive method, in the first phase, the voltage of the first node and the voltage of the second node are controlled by the input circuit to control the output of the first output circuit and the output of the second output circuit, and the output of the third output circuit is controlled based on the voltage of the second node and the second clock signal. In the second phase, the voltage of the second node is held by the hold circuit, the voltage of the first node is inverted under the control of the input circuit, and the voltage of the third node and the voltage of the fourth node are controlled by the output selection circuit to control the output of the first output circuit and the output of the second output circuit respectively. In the third phase, the voltage of the first node and the voltage of the second node are controlled by the input circuit to control the output of the first output circuit and the output of the second output circuit. In the fourth phase, the voltage of the first node and the voltage of the second node are held, and the output of the first output circuit and the output of the second output circuit are controlled based on the voltage of the first node.

In embodiments of the present disclosure, in the second phase, the second clock signal is outputted from the first output circuit in the case of controlling the voltage of the third node to turn on the first output circuit. The output of the first output circuit is held by the hold circuit in the case of controlling the voltage of the third node to turn off the first output circuit.

In embodiments of the present disclosure, in the second phase, the second clock signal is outputted from the second output circuit in the case of controlling the voltage of the fourth node to turn on the second output circuit. The output of the second output circuit is held by the hold circuit in the case of controlling the voltage of the fourth node to turn off the second output circuit.

A third aspect of the present disclosure provides a gate drive device. The gate drive device includes a plurality of cascaded shift registers as mentioned above. An input terminal of a first-stage shift register is inputted with a scan enable signal. An input terminal of each of the shift registers at stages other than the first stage is coupled to a third output terminal of a previous-stage shift register, the first clock signal terminal of each of the shift registers at stages other than the first stage is coupled to a second clock signal terminal of the previous-stage shift register, and the second clock signal terminal of each of the shift registers at stages other than the first stage is coupled to the first clock signal terminal of the previous-stage shift register.

A fourth aspect of the present disclosure provides an array substrate, which includes the gate drive device as mentioned above.

A fifth aspect of the present disclosure provides a display device, which includes the array substrate as mentioned above.

The shift register and the gate drive device according to the embodiments of the present disclosure improves a structure of the shift register so that the shift register is applicable to the foldable display, and the delay of the output signal can be better controlled, thereby ensuring it is more advantageous to drive the array substrate and the display device used in the foldable display.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

DETAILED DESCRIPTION

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on a P-type transistor. Therefore, in the embodiments of the present disclosure, a controlled intermediate terminal of the transistor is referred to as a control electrode, a signal input terminal is referred to as a first electrode, and a signal output terminal is referred to as a second electrode. The transistors used in the embodiments of the present disclosure mainly are switching transistors. In addition, terms such as "first" and "second" are only used to distinguish one element (or a part of the element) from another element (or another part of this element).

Figure 1:
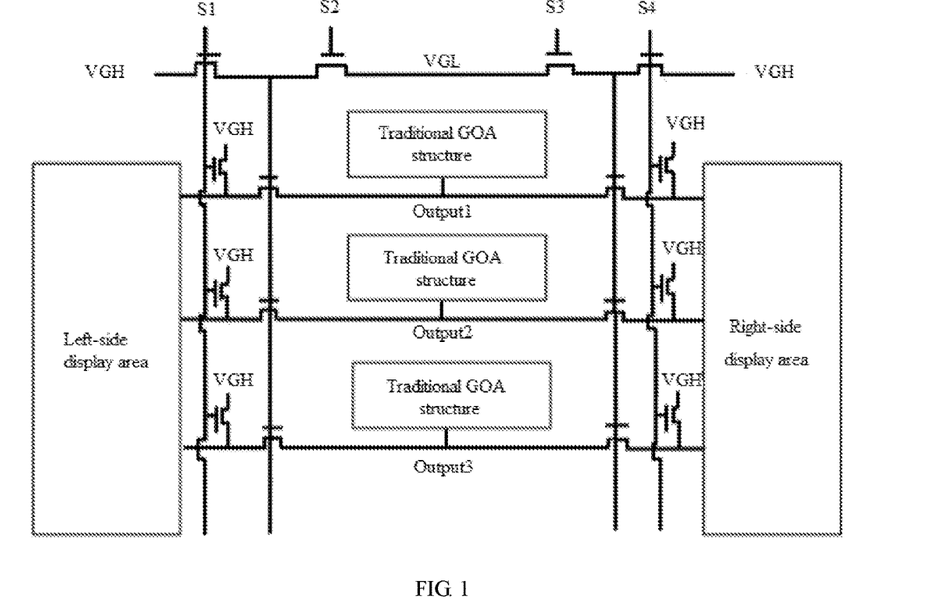
FIG. 1 is an exemplary diagram of an existing drive circuit applicable to a foldable display.

A structure of an existing drive circuit used for driving a foldable display is, for example, the structure as shown in FIG. 1. The drive circuit uses a plurality of cascaded traditional shift registers to synchronously send the same scanning signal to a left-side display area and a right-side display area, and control on or off of the left-side display area and a right-side display area by a control circuit arranged between the shift registers and the left-side display area and the right-side display area. As shown in FIG. 1, the display of the left-side display area is controlled by control signals S1 and S2, and the display of the right-side display area is controlled by control signals S3 and S4. However, this manner may make it more difficult to control delay of the output signal.

Figure 2:
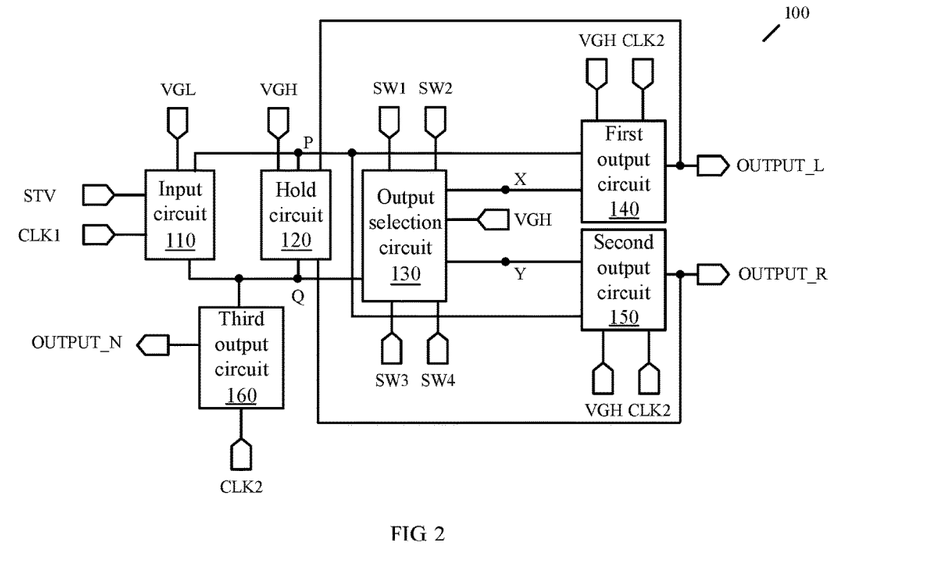
FIG. 2 is an exemplary block diagram of a shift register according to an embodiment of the present disclosure.

FIG. 2 illustrates an exemplary block diagram of a shift register 100 according to an embodiment of the present disclosure. The shift register 100 includes an input circuit 110, a hold circuit 120, an output selection circuit 130, a first output circuit 140, a second output circuit 150, and a third output circuit 160.

The input circuit 110 is connected to the hold circuit 120, the output selection circuit 130, the first output circuit 140, the second output circuit 150 and the third output circuit 160, and is configured to control a voltage of a first node P and a voltage of a second node Q (the first node P and the second node Q are between the input circuit 110 and the hold circuit 120) based on a start signal from an input terminal STV, a first clock signal CLK1 from a first clock signal terminal CLK1, and a first voltage VGL from a first voltage terminal.

The hold circuit 120 is connected to the output selection circuit 130, the first output circuit 140, the second output circuit 150 and the third output circuit 160, and is configured to hold the voltage of the first node P and the voltage of the second node Q as well as an output voltage of the first output circuit 140 and an output voltage of the second output circuit 150.

The output selection circuit 130 is connected to the first output circuit 140 and the second output circuit 150, and is configured to control a voltage of a third node X based on a first selection signal SW1, a second selection signal SW2, the voltage of the second node Q and a second voltage VGH from a second voltage terminal, and control a voltage of a fourth node Y based on a third selection signal SW3, a fourth selection signal SW4, the voltage of the second node Q and the second voltage VGH.

The first output circuit 140 is configured to selectively output, from a first output terminal OUTPUT_L, a second clock signal CLK2 from a second clock signal terminal CLK2 or the second voltage VGH based on the voltage of the first node P and the voltage of the third node X.

The second output circuit 150 is configured to selectively output, from a second output terminal OUTPUT_R, the second clock signal CLK2 or the second voltage VGH based on the voltage of the first node P and the voltage of the fourth node Y.

The third output circuit 160 is configured to selectively output, from a third output terminal OUTPUT_N, the second clock signal CLK2 or the voltage of the second node Q based on the second clock signal CLK2 and the voltage of the second node Q.

The output selection circuit 130 is arranged between the input circuit 110 and the first output circuit 140 and the second output circuit 150, and can make a selection of whether to enable the output of a scanning signal before the first output circuit 140 and the second output circuit 150 output a signal. Therefore, the shift register 100 according to this embodiment can better control the delay of the output signal. Moreover, the shift register 100 according to this embodiment has the third output circuit 160, which is not controlled by the output selection circuit 130. Therefore, the third output circuit 160 can provide a start signal to a next-stage shift register no matter whether the scanning signal is outputted to any of the left-side display area and the right-side display area or not.

Figure 3:
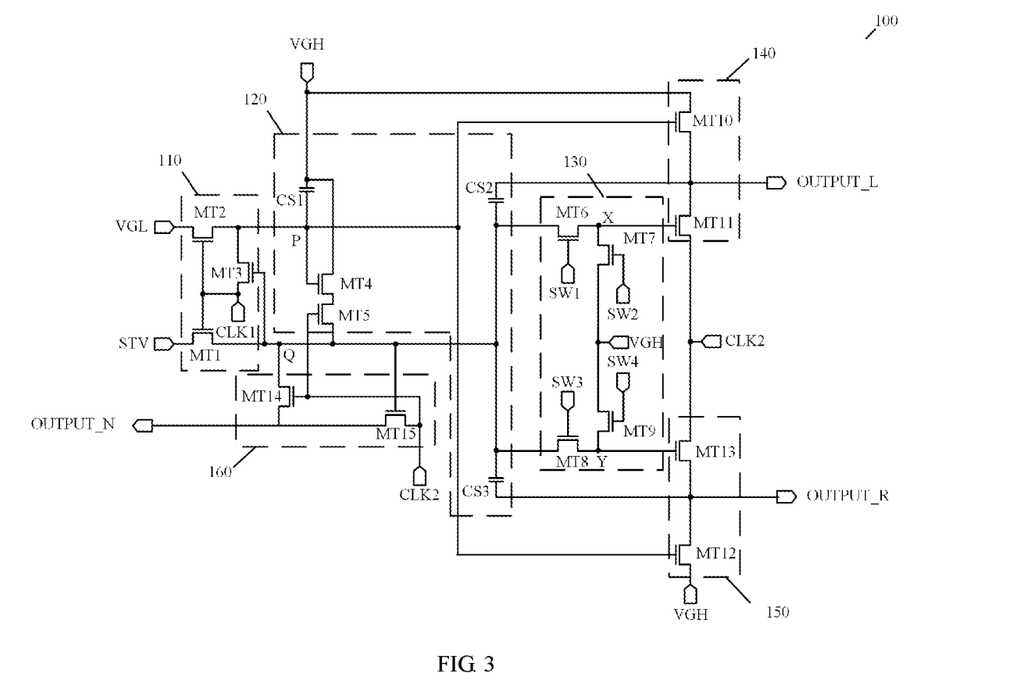
FIG. 3 is an exemplary circuit diagram of a shift register according to an embodiment of the present disclosure.

FIG. 3 illustrates an exemplary circuit diagram of the shift register 100 according to an embodiment of the present disclosure.

The input circuit 110 includes a first transistor MT1, a second transistor MT2, and a third transistor MT3. A control electrode of the first transistor MT1 is coupled to the first clock signal terminal CLK1, a first electrode of the first transistor MT1 is coupled to the input terminal STV, and a second electrode of the first transistor MT1 is coupled to the second node Q. A control electrode of the second transistor MT2 is coupled to the first clock signal terminal CLK1, a first electrode of the second transistor MT2 is coupled to the first voltage terminal, and a second electrode of the second transistor MT2 is coupled to the first node P. A control electrode of the third transistor MT3 is coupled to the second node Q, a first electrode of the third transistor MT3 is coupled to the first clock signal terminal CLK1, and a second electrode of the third transistor MT3 is coupled to the first node P.

The hold circuit 120 includes a first capacitor CS1, a second capacitor CS2, a third capacitor CS3, a fourth transistor MT4, and a fifth transistor MT5. A first terminal of the first capacitor CS1 is coupled to the first node P, and a second terminal of the first capacitor CS1 is coupled to a second voltage terminal. A first terminal of the second capacitor CS2 is coupled to the second node Q, and a second terminal of the second capacitor CS2 is coupled to the first output terminal OUTPUT_L. A first terminal of the third capacitor CS3 is coupled to the second node Q, and a second terminal of the third capacitor CS3 is coupled to the second output terminal OUTPUT_R. A control electrode of the fourth transistor MT4 is coupled to the first node P, a first electrode of the fourth transistor MT4 is coupled to the second voltage terminal, and a second electrode of the fourth transistor MT4 is coupled to a first electrode of the fifth transistor MT5. A control electrode of the fifth transistor MT5 is coupled to a second clock signal terminal CLK2, and a second electrode of the fifth transistor MT5 is coupled to the second node Q.

The output selection circuit 130 includes a sixth transistor MT6, a seventh transistor MT7, an eighth transistor MT8, and a ninth transistor MT9. A control electrode of the sixth transistor MT6 is coupled to a first selection signal SW1, a first electrode of the sixth transistor MT6 is coupled to the second node Q, and a second electrode of the sixth transistor MT6 is coupled to the third node X. A control electrode of the seventh transistor MT7 is coupled to a second selection signal SW2, a first electrode of the seventh transistor MT7 is coupled to the second voltage terminal, and a second electrode of the seventh transistor MT7 is coupled to the third node X. A control electrode of the eighth transistor MT8 is coupled to a third selection signal SW3, a first electrode of the eighth transistor MT8 is coupled to the second node Q, and a second electrode of the eighth transistor MT8 is coupled to the fourth node Y. A control electrode of the ninth transistor MT9 is coupled to a fourth selection signal SW4, a first electrode of the ninth transistor MT9 is coupled to the second voltage terminal, and a second electrode of the ninth transistor MT9 is coupled to the fourth node Y.

The first output circuit 140 includes a tenth transistor MT10 and an eleventh transistor MT11. A control electrode of the tenth transistor MT10 is coupled to the first node P, a first electrode of the tenth transistor MT10 is coupled to the second voltage terminal, and a second electrode of the tenth transistor MT10 is coupled to the first output terminal OUTPUT_L. A control electrode of the eleventh transistor MT11 is coupled to the third node X, a first electrode of the eleventh transistor MT11 is coupled to a second clock signal terminal CLK2, and a second electrode of the eleventh transistor MT11 is coupled to the first output terminal OUTPUT_L.

The second output circuit 150 includes a twelfth transistor MT12 and a thirteenth transistor MT13. A control electrode of the twelfth transistor MT12 is coupled to the first node P, a first electrode of the twelfth transistor MT12 is coupled to the second voltage terminal, and a second electrode of the twelfth transistor MT12 is coupled to the second output terminal OUTPUT_R. A control electrode of the thirteenth transistor MT13 is coupled to the fourth node Y, a first electrode of the thirteenth transistor MT13 is coupled to a second clock signal terminal CLK2, and a second electrode of the thirteenth transistor MT13 is coupled to the second output terminal OUTPUT_R.

The third output circuit 160 includes a fourteenth transistor MT14 and a fifteenth transistor MT15. A control electrode of the fourteenth transistor MT14 is coupled to a second clock signal terminal CLK2, a first electrode of the fourteenth transistor MT14 is coupled to the second node Q, and a second electrode of the fourteenth transistor MT14 is coupled to the third output terminal OUTPUT_N. A control electrode of the fifteenth transistor MT15 is coupled to the second node Q, a first electrode of the fifteenth transistor MT15 is coupled to the second clock signal terminal CLK2, and a second electrode of the fifteenth transistor MT15 is coupled to the third output terminal OUTPUT_N.

Figure 4:
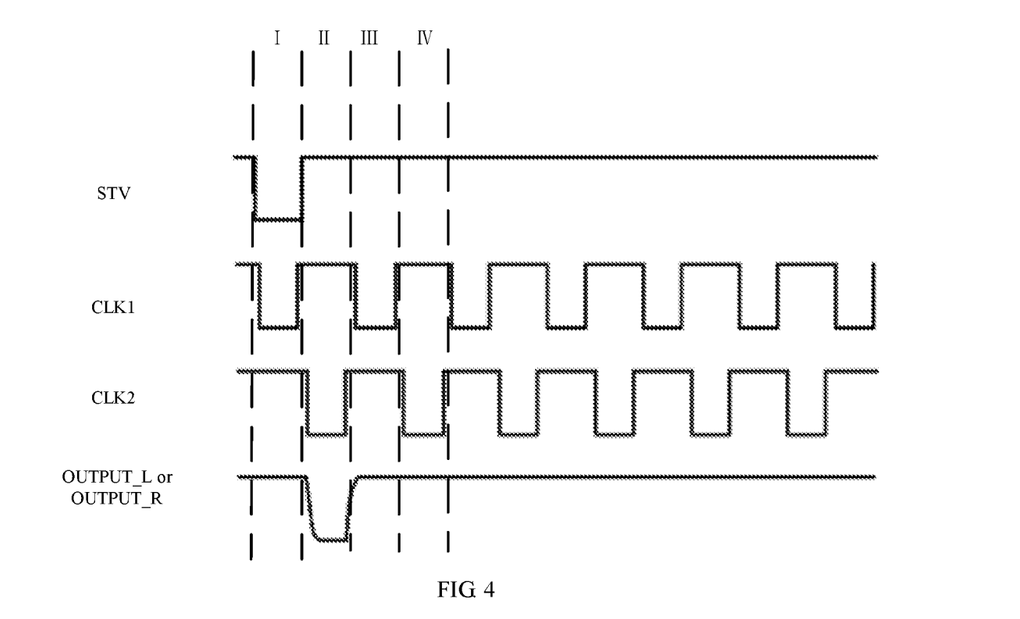
FIG. 4 is a timing diagram of each signal of the shift register as shown in FIG. 3.

FIG. 4 illustrates a timing diagram of each signal of the shift register as shown in FIG. 3. A working process of the shift register unit 100 according to the embodiments of the present disclosure is described below with reference to FIG. 3 taking a P-type transistor as an example. In the following embodiments, the first voltage VGL="0", which denotes a low voltage, and the second voltage VGH="1", which denotes a high voltage.

First, description is made taking a full screen display as an example. Before scanning, the first selection signal SW1 may be set to low voltage, the second selection signal SW2 may be set to high voltage, the third selection signal SW3 may be set to low voltage, and the fourth selection signal SW4 may be set to high voltage. The sixth transistor MT6 is turned on because the first selection signal SW1 is at low voltage. The seventh transistor MT7 is turned off because the second selection signal SW2 is at high voltage. The eighth transistor MT8 is turned on because the third selection signal SW3 is at low voltage. The ninth transistor MT9 is turned off because the fourth selection signal SW4 is at high voltage.

In the first phase, STV=0, CLK1=0, and CLK2=1.

Both the first transistor MT1 and the second transistor MT2 are turned on because the first selection signal SW1 is at low voltage. The low voltage from the first voltage VGL is inputted to the first node P via the second transistor MT2, such that both the tenth transistor MT10 and the twelfth transistor MT12 are turned on. Consequently, the high voltage from the second voltage VGH is outputted from the first output terminal OUTPUT_L and the second output terminal OUTPUT_R respectively. The low voltage from the input terminal STV is inputted to the second node Q via the first transistor MT1, such that the low voltage is inputted to the first terminal of the second capacitor CS2 and the first terminal of the third capacitor CS3 respectively. The low voltage from the second node Q sets both the third node X and the fourth node Y to the low voltage via the sixth transistor MT6 and the eighth transistor MT8 respectively. Therefore, both the eleventh transistor MT11 and the thirteenth transistor MT13 are turned on, such that the high voltage from the second clock signal CLK2 is outputted from the first output terminal OUTPUT_L and the second output terminal OUTPUT_R respectively. As to the third output circuit 160, the fifteenth transistor MT15 is turned on because the second node Q is at low voltage, and the high voltage from the second clock signal CLK2 is outputted from the third output terminal OUTPUT_N. Furthermore, the high voltage from the second clock signal CLK2 turns the fourteenth transistor MT14 off, and thus the voltage of the second node Q does not affect the output of the third output terminal OUTPUT_N.

In the second phase, STV=1, CLK1=1, and CLK2=0.

Both the first transistor MT1 and the second transistor MT2 are turned off because the first clock signal CLK1 is at high voltage. The voltage of the second node Q is held at low voltage by the second capacitor CS2 and the third capacitor CS3, such that both the third node X and the fourth node Y are held at low voltage. Therefore, both the eleventh transistor MT11 and the thirteenth transistor MT13 are turned on, such that the low voltage from the second clock signal CLK2 is outputted from the first output terminal OUTPUT_L and the second output terminal OUTPUT_R respectively. Moreover, the low voltage from the second node Q turns the third transistor MT3 on. The high voltage from the first clock signal CLK1 is inputted to the first node P by the third transistor MT3, such that both the tenth transistor MT10 and the twelfth transistor MT12 are turned off. Therefore, in this phase, the high voltage from the second voltage VGH does not affect the signal from the first output terminal OUTPUT_L and the signal from the second output terminal OUTPUT_R. As to the third output circuit 160, the fifteenth transistor MT15 is turned on because the second node Q is at low voltage, and the low voltage from the second clock signal CLK2 is outputted from the third output terminal OUTPUT_N. Moreover, the low voltage from the second clock signal CLK2 turns the fourteenth transistor MT14 on, such that the low voltage from the second node Q is outputted from the third output terminal OUTPUT_N.

In the third phase, STV=1, CLK1=0, and CLK2=1.

Both the first transistor MT1 and the second transistor MT2 are turned on because the first clock signal CLK1 is at low voltage. The low voltage from the first voltage VGL is inputted to the first node P via the second transistor MT2, such that the first terminal of the first capacitor CS1 is inputted with the low voltage and both the tenth transistor MT10 and the twelfth transistor MT12 are turned on. Consequently, the high voltage from the second voltage VGH is outputted from the first output terminal OUTPUT_L and the second output terminal OUTPUT_R respectively. The high voltage from the input terminal STV is inputted to the second node Q via the first transistor MT1, such that the high voltage is inputted to the first terminal of the second capacitor CS2 and the first terminal of the third capacitor CS3 respectively. The high voltage from the second node Q sets both the third node X and the fourth node Y to the high voltage via the sixth transistor MT6 and the eighth transistor MT8 respectively. Therefore, both the eleventh transistor MT11 and the thirteenth transistor MT13 are turned off, and in this phase, neither the first output terminal OUTPUT_L nor the second output terminal OUTPUT_R is affected by the second clock signal CLK2. As to the third output circuit 160, the fifteenth transistor MT15 is turned off because the second node Q is at high voltage. Furthermore, the high voltage from the second clock signal CLK2 turns the fourteenth transistor MT14 off, and thus, in this phase, the voltage of the third output terminal OUTPUT_N is not controlled by the shift register at this stage.

In the fourth phase, STV=1, CLK1=1, and CLK2=0.

Both the first transistor MT1 and the second transistor MT2 are turned off because the first clock signal CLK1 is at high voltage. The voltage of the first node P is held at low voltage by the first capacitor CS1, such that both the tenth transistor MT10 and the twelfth transistor MT12 are turned on. Consequently, the high voltage from the second voltage VGH is outputted from the first output terminal OUTPUT_L and the second output terminal OUTPUT_R respectively. The low voltage from the first node P turns the fourth transistor MT4 on, and the low voltage from the second clock signal CLK2 turns the fifth transistor MT5 on. Therefore, the high voltage from the second voltage VGH sets the second node Q to high voltage via the fourth transistor MT4 and the fifth transistor MT5. The high voltage from the second node Q sets both the third node X and the fourth node Y to high voltage via the sixth transistor MT6 and the eighth transistor MT8 respectively. Therefore, both the eleventh transistor MT11 and the thirteenth transistor MT13 are turned off, and in this phase, neither the first output terminal OUTPUT_L nor the second output terminal OUTPUT_R is affected by the second clock signal CLK2. As to the third output circuit 160, the fifteenth transistor MT15 is turned off because the second node Q is at high voltage. The low voltage from the second clock signal CLK2 turns the fourteenth transistor MT14 on, such that the high voltage from the second node Q is outputted from the third output terminal OUTPUT_N.

In this embodiment, as shown in FIG. 4, a duty ratio of the first clock signal CLK1 is greater than 1/2, and a phase difference between the second clock signal CLK2 and the first clock signal CLK1 is equal to half of a cycle. During a transition from one phase to a next phase, both the first clock signal CLK1 and the second clock signal CLK2 are at high voltage. Therefore, instability of output voltage of the shift register 100 may be avoided. For example, in the second phase, before the high voltage from the first clock signal CLK1 is inputted to the first node P via the third transistor MT3 such that both the tenth transistor MT10 and the twelfth transistor MT11 are turned off, the second clock signal CLK2 is also at high voltage. In this way, instability of the output voltage of the first output terminal OUTPUT_L and instability of the output voltage of the second output terminal OUTPUT_R may be avoided.

Furthermore, the output selection circuit used for the first output terminal OUTPUT_L and the second output terminal OUTPUT_R is configured to control the control terminal of the eleventh transistor MT11 and the control terminal of the thirteenth transistor MT13, such that the delay of an output signal from the first output terminal OUTPUT_L and the second output terminal OUTPUT_R can be better controlled.

In an alternative embodiment, it is possible to set the first selection signal SW1 to low voltage, to set the second selection signal SW2 to high voltage, to set the third selection signal SW3 to low voltage, and to set the fourth selection signal SW4 to high voltage only in the second phase. Alternatively, it is possible to set the first selection signal SW1 to low voltage, to set the second selection signal SW2 to high voltage, to set the third selection signal SW3 to low voltage, and to set the fourth selection signal SW4 to high voltage during several phases including the second phase.

A scanning process is described below taking an example where a first display area (corresponding to the display area of the first output terminal OUTPUT_L) is turned off. Before scanning, the first selection signal SW1 may be set to high voltage, the second selection signal SW2 may be set to low voltage, the third selection signal SW3 may be set to low voltage, and the fourth selection signal SW4 may be set to high voltage. The sixth transistor MT6 is turned off because the first selection signal SW1 is at high voltage. The seventh transistor MT7 is turned on because the second selection signal SW2 is at low voltage. The eleventh transistor MT11 is turned off because the voltage of the third node X is the high voltage from the second voltage VGH. Therefore, in this example, the first output terminal OUTPUT_L is not affected by the second clock signal CLK2 in each phase. The eighth transistor MT8 is turned on because the third selection signal SW3 is at low voltage. The ninth transistor MT9 is turned off because the fourth selection signal SW4 is at high voltage.

In the first phase, STV=0, CLK1=0, and CLK2=1.

Both the first transistor MT1 and the second transistor MT2 are turned on because the first selection signal SW1 is at low voltage. The low voltage from the first voltage VGL is inputted to the first node P via the second transistor MT2, such that both the tenth transistor MT10 and the twelfth transistor MT12 are turned on. Consequently, the high voltage from the second voltage VGH is outputted from the first output terminal OUTPUT_L and the second output terminal OUTPUT_R respectively. The high voltage from the second voltage VGH inputs the high voltage to the second terminal of the second capacitor CS2. The low voltage from the input terminal STV is inputted to the second node Q via the first transistor MT1, such that the low voltage is inputted to the first terminal of the second capacitor CS2 and the first terminal of the third capacitor CS3 respectively. The low voltage from the second node Q sets the fourth node Y to low voltage via the eighth transistor MT8. Therefore, the thirteenth transistor MT13 is turned on, such that the high voltage from the second clock signal CLK2 is outputted from the second output terminal OUTPUT_R. As to the third output circuit 160, the fifteenth transistor MT15 is turned on because the second node Q is at low voltage, and the high voltage from the second clock signal CLK2 is outputted from the third output terminal OUTPUT_N. Furthermore, the high voltage from the second clock signal CLK2 turns the fourteenth transistor MT14 off, and thus the voltage of the second node Q does not affect the output of the third output terminal OUTPUT_N.

In the second phase, STV=1, CLK1=1, and CLK2=0.

Both the first transistor MT1 and the second transistor MT2 are turned off because the first clock signal CLK1 is at high voltage. The voltage of the second node Q is held at low voltage by the second capacitor CS2 and the third capacitor CS3, such that the fourth node Y is held at low voltage. Therefore, the thirteenth transistor MT13 is turned on, such that the second output terminal OUTPUT_R outputs the low voltage from the second clock signal CLK2. Moreover, the low voltage from the second node Q turns the third transistor MT3 on. The high voltage from the first clock signal CLK1 is inputted to the first node P via the third transistor MT3, such that both the tenth transistor MT10 and the twelfth transistor MT12 are turned off. Therefore, in this phase, the high voltage from the second voltage VGH does not affect the signal from the first output terminal OUTPUT_L and the signal from the second output terminal OUTPUT_R. The first output terminal OUTPUT_L outputs the high voltage because the second terminal of the second capacitor CS2 is held at high voltage. As to the third output circuit 160, the fifteenth transistor MT15 is turned on because the second node Q is at low voltage, and the low voltage from the second clock signal CLK2 is outputted from the third output terminal OUTPUT_N. Moreover, the low voltage from the second clock signal CLK2 turns the fourteenth transistor MT14 on, such that the low voltage from the second node Q is outputted from the third output terminal OUTPUT_N.

In the third phase, STV=1, CLK1=0, and CLK2=1.

Both the first transistor MT1 and the second transistor MT2 are turned on because the first clock signal CLK1 is at low voltage. The low voltage from the first voltage VGL is inputted to the first node P via the second transistor MT2, such that the first terminal of the first capacitor CS1 is inputted with the low voltage and both the tenth transistor MT10 and the twelfth transistor MT12 are turned on. Consequently, the high voltage from the second voltage VGH is outputted from the first output terminal OUTPUT_L and the second output terminal OUTPUT_R respectively. The high voltage from the input terminal STV is inputted to the second node Q via the first transistor MT1, such that the high voltage is inputted to the first terminal of the second capacitor CS2 and the first terminal of the third capacitor CS3 respectively. The high voltage from the second node Q sets the fourth node Y to high voltage via the eighth transistor MT8. Therefore, the thirteenth transistor MT13 is turned off, and in this phase, the second output terminal OUTPUT_R is not affected by the second clock signal CLK2. As to the third output circuit 160, the fifteenth transistor MT15 is turned off because the second node Q is at high voltage. Furthermore, the high voltage from the second clock signal CLK2 turns the fourteenth transistor MT14 off, and thus, in this phase, the voltage of the third output terminal OUTPUT_N is not controlled by the shift register at this stage.

In the fourth phase, STV=1, CLK1=1, and CLK2=0.

Both the first transistor MT1 and the second transistor MT2 are turned off because the first clock signal CLK1 is at high voltage. The voltage of the first node P is held at the low voltage by the first capacitor CS1, such that both the tenth transistor MT10 and the twelfth transistor MT12 are turned on. Consequently, the high voltage from the second voltage VGH is outputted from the first output terminal OUTPUT_L and the second output terminal OUTPUT_R respectively. The low voltage from the first node P turns the fourth transistor MT4 on, and the low voltage from the second clock signal CLK2 turns the fifth transistor MT5 on. Therefore, the high voltage from the second voltage VGH holds the second node Q at high voltage via the fourth transistor MT4 and the fifth transistor MT5. The fourth node Y is held at the high voltage by the high voltage from the second node Q via the eighth transistor MT8. Therefore, the thirteenth transistor MT13 is turned off, and in this phase, the second output terminal OUTPUT_R is not affected by the second clock signal CLK2. As to the third output circuit 160, the fifteenth transistor MT15 is turned off because the second node Q is at high voltage. The low voltage from the second clock signal CLK2 turns the fourteenth transistor MT14 on, such that the high voltage from the second node Q is outputted from the third output terminal OUTPUT_N.

In this example, the third output terminal OUTPUT_N may still output a start signal used for a next-stage shift register in the case that the first output terminal OUTPUT_L does not output the scanning signal. Therefore, turning the first display area off may not have a negative effect on the display of a second display area (the display area corresponding to the second output terminal OUTPUT_R).

In an alternative embodiment, it is possible to set the first selection signal SW1 to high voltage, to set the second selection signal SW2 to low voltage, to set the third selection signal SW3 to low voltage, and to set the fourth selection signal SW4 to high voltage only in the second phase. Alternatively, it is possible to set the first selection signal SW1 to high voltage, to set the second selection signal SW2 to low voltage, to set the third selection signal SW3 to low voltage, and to set the fourth selection signal SW4 to high voltage during several phases including the second phase.

Those skilled in the art should understand that similarly to the above example, in the embodiment where the second display area is turned off, the third selection signal SW3 may be set to high voltage and the fourth selection signal SW4 may be set to low voltage before starting the scanning. Alternatively, the above settings may be made only in the second phase or during several phases including the second phase.

Similarly, those skilled in the art should understand that by changing the voltage of each signal in the shift register 100, the circuits of the shift register unit 100 according to the embodiments of the present disclosure may be implemented by using N-type transistors, or may be implemented by using some P-type transistors and some N-type transistors.

Figure 5:
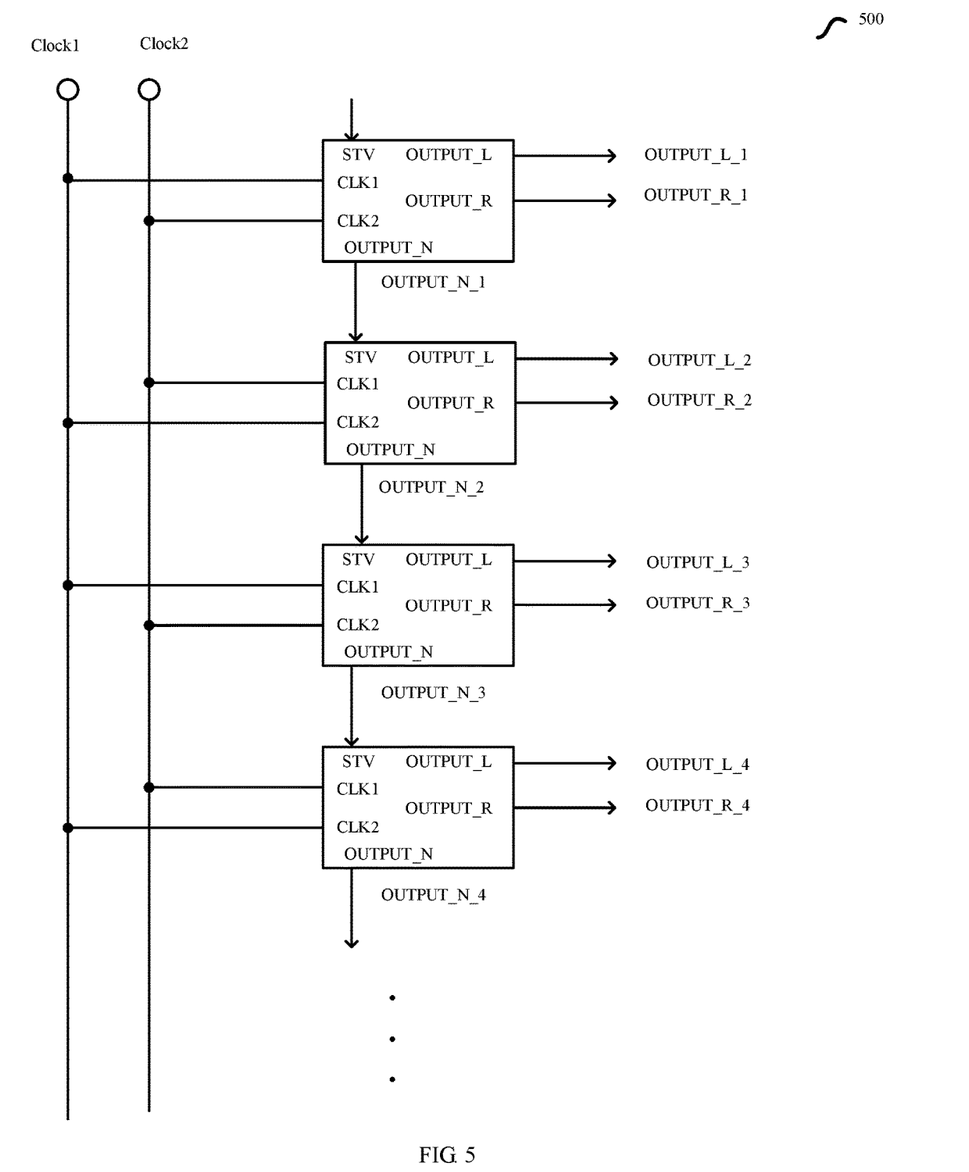
FIG. 5 is an exemplary block diagram of a gate drive device according to an embodiment of the present disclosure.

FIG. 5 illustrates an exemplary block diagram of a gate drive device 500 according to an embodiment of the present disclosure. The gate drive device 500 includes a plurality of cascaded shift registers 100 as mentioned above. An input terminal STV of a first-stage shift register is inputted with a scan enable signal. An input terminal STV of each of the shift registers at stages other than the first stage is coupled to a third output terminal OUTPUT_N of a previous-stage shift register, the first clock signal terminal CLK1 of each of the shift registers at stages other than the first stage is coupled to a second clock signal terminal CLK2 of the previous-stage shift register, and the second clock signal terminal CLK2 of each of the shift registers at stages other than the first stage is coupled to the first clock signal terminal CLK1 of the previous-stage shift register.

As shown in FIG. 5, in the first-stage shift register, an input terminal STV is inputted with a scan enable signal. The first clock signal terminal CLK1 is coupled to a first clock signal Clock1. The second clock signal terminal CLK2 is coupled to a second clock signal Clock2. A first output signal OUTPUT_L 1 is outputted from the first output terminal OUTPUT_L. A second output signal OUTPUT_R 1 is outputted from the second output terminal OUTPUT_R. A third output signal OUTPUT_N_1 is outputted from the third output terminal OUTPUT_N.

In the second-stage shift register, the input terminal STV is inputted with the third output signal OUTPUT_N_1 from the first-stage shift register. The first clock signal terminal CLK1 is coupled to the second clock signal Clock2. The second clock signal terminal CLK2 is coupled to the first clock signal Clock1. A first output signal OUTPUT_L_2 is outputted from the first output terminal OUTPUT_L. A second output signal OUTPUT_R_2 is outputted from the second output terminal OUTPUT_R. A third output signal OUTPUT_N_2 is outputted from the third output terminal OUTPUT_N.

In the third-stage shift register, the input terminal STV is inputted with the third output signal OUTPUT_N_2 from the second-stage shift register. The first clock signal terminal CLK1 is coupled to the first clock signal Clock1. The second clock signal terminal CLK2 is coupled to the second clock signal Clock2. A first output signal OUTPUT_L_3 is outputted from the first output terminal OUTPUT_L. A second output signal OUTPUT_R_3 is outputted from the second output terminal OUTPUT_R. A third output signal OUTPUT_N_3 is outputted from the third output terminal OUTPUT_N.

In the fourth-stage shift register, the input terminal STV is inputted with the third output signal OUTPUT_N_3 from the third-stage shift register. The first clock signal terminal CLK1 is coupled to the second clock signal Clock2. The second clock signal terminal CLK2 is coupled to the first clock signal Clock1. A first output signal OUTPUT_L_4 is outputted from the first output terminal OUTPUT_L. A second output signal OUTPUT_R_4 is outputted from the second output terminal OUTPUT_R. A third output signal OUTPUT_N_4 is outputted from the third output terminal OUTPUT_N.

The subsequent shift registers are connected in a similar fashion, and thus are not necessarily described any more.

Figure 6:
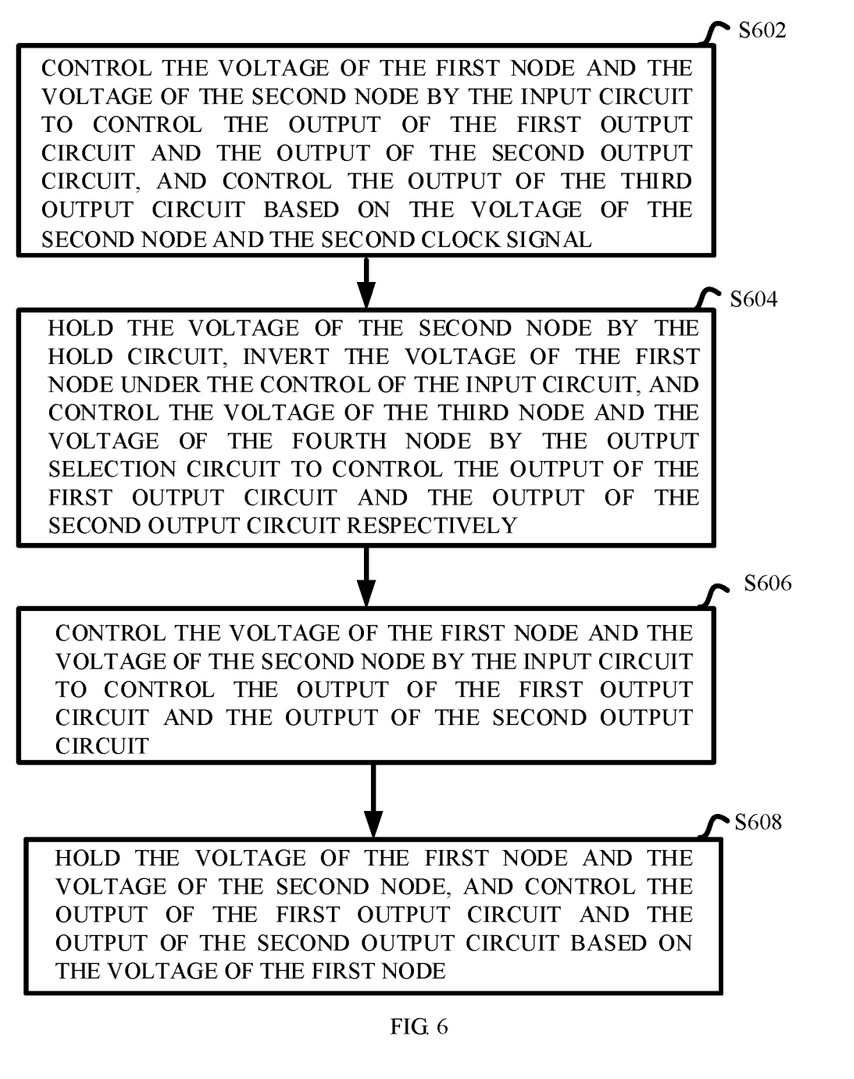
FIG. 6 is a schematic flowchart of a drive method for driving the shift register as shown in FIG. 2 according to an embodiment of the present disclosure.

FIG. 6 illustrates a schematic flowchart of a drive method for driving the shift register 100 as shown in FIG. 2 according to an embodiment of the present disclosure.

In the first phase (i.e., Step S602), under the control of the first clock signal CLK1, the voltage of the first node P is set by the first voltage terminal and the voltage of the second node Q is set by the input terminal STV to control the output of the first output circuit 140 and the output of the second output circuit 150. The output of the third output circuit 160 is controlled based on the voltage of the second node Q and the second clock signal CLK2.

In the second phase (i.e., Step S604), the voltage of the second node Q is held. The first clock signal CLK1 is inputted to the first node P under the control of the voltage of the second node Q. The voltage of the third node X is controlled based on the first selection signal SW1 and the second selection signal SW2 to control the output of the first output circuit 140. The voltage of the fourth node Y is controlled based on the third selection signal SW3 and the fourth selection signal SW4 to control the output of the second output circuit 150. The output of the third output circuit 160 is controlled based on the voltage of the second node Q and the second clock signal CLK2.

In the third phase (i.e., Step S606), under the control of the first clock signal CLK1, the voltage of the first node P is set by the first voltage terminal and the voltage of the second node Q is set by the input terminal STV to control the output of the first output circuit 140 and the output of the second output circuit 150.

In the fourth phase (i.e., Step S608), the voltage of the first node P and the voltage of the second node Q are held. The output of the first output circuit 140 and the output of the second output circuit 150 are controlled based on the voltage of the first node P. The output of the third output circuit 160 is controlled based on the voltage of the second node Q and the second clock signal CLK2.

In one example, in the second phase, the second clock signal CLK2 is outputted from the first output circuit 140 in the case of controlling the voltage of the third node X to turn on the first output circuit 140. The output of the first output circuit 140 is held by the hold circuit 120 in the case of controlling the voltage of the third node X to turn off the first output circuit 140.

In one example, in the second phase, the second clock signal CLK2 is outputted from the second output circuit 150 in the case of controlling the voltage of the fourth node Y to turn on the second output circuit 150. The output of the second output circuit 150 is held by the hold circuit 120 in the case of controlling the voltage of the fourth node Y to turn off the second output circuit 150.

Figure 7:
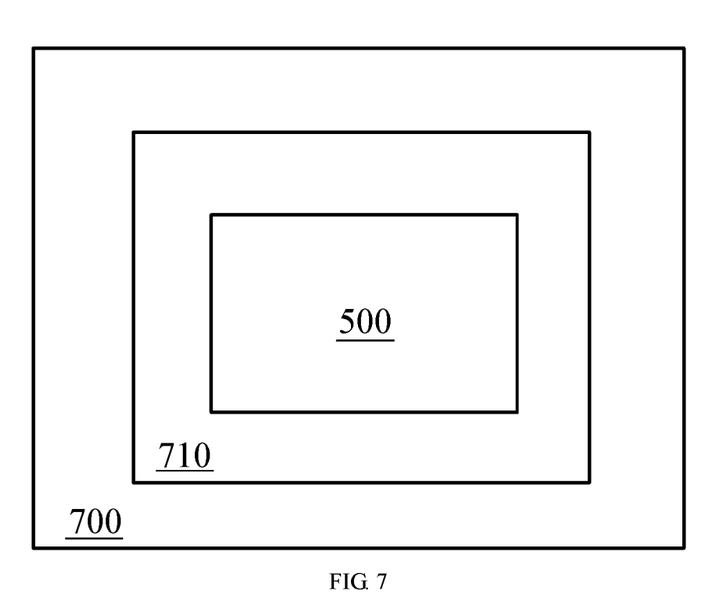
FIG. 7 illustrates a schematic structural diagram of a display device according to an embodiment of the present disclosure.

FIG. 7 illustrates a schematic structural diagram of a display apparatus 700 according to an embodiment of the present disclosure. The display apparatus 700 may include an array substrate 710. The array substrate 710 may include the gate drive device 500 as shown in FIG. 5.

As mentioned above, in the shift register and the drive method thereof and the gate drive device according to the embodiments of the present disclosure, the structure of the shift register is improved so that the shift register is applicable to the foldable display, and the delay of the output signal can be better controlled, thereby being more advantageous to driving the array substrate and the display device used in the foldable display.

The display apparatus provided by the embodiments of the present disclosure may be used in any product having a display function, such as an electronic paper display, a mobile phone, a tablet computer, a TV set, a notebook computer, a digital photo frame or a navigation apparatus, and so on.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A shift register comprising:
an input circuit, a hold circuit, an output selection circuit, a first output circuit, a second output circuit, and a third output circuit;
wherein the input circuit is coupled to the hold circuit, the first output circuit, and the second output circuit via a first node, coupled to the output selection circuit and the third output circuit via a second node, coupled to an input terminal, a first clock signal terminal, and a first voltage terminal, and configured to provide a start signal from the input terminal to the second node based on a first clock signal from the first clock signal terminal, and provide a first voltage from the first voltage terminal to the first node based on the first clock signal and provide the first clock signal to the first node based on a voltage of the second node;
wherein the hold circuit is configured to hold the voltage of the first node and the voltage of the second node as well as an output signal of the first output circuit and an output signal of the second output circuit;
wherein the output selection circuit is coupled to the first output circuit via a third node, coupled to the second output circuit via a fourth node, and configured to provide the voltage of the second node to at least one of the third node and the fourth node;
wherein the first output circuit is coupled to a first output terminal, and configured to output a first output signal from the first output terminal based on the voltage of the first node and the voltage of the third node;
wherein the second output circuit is coupled to a second output terminal, and configured to output a second output signal from the second output terminal based on the voltage of the first node and the voltage of the fourth node; and
wherein the third output circuit is coupled to a second clock signal terminal, and a third output terminal, and configured to output a third output signal from the third output terminal based on a second clock signal from the second clock signal terminal and the voltage of the second node.

2. The shift register according to claim 1, wherein the input circuit comprises a first transistor, a second transistor, and a third transistor;
wherein a control electrode of the first transistor is coupled to the first clock signal terminal, wherein a first electrode of the first transistor is coupled to the input terminal, and wherein a second electrode of the first transistor is coupled to the second node;
wherein a control electrode of the second transistor is coupled to the first clock signal terminal, wherein a first electrode of the second transistor is coupled to the first voltage terminal, and wherein a second electrode of the second transistor is coupled to the first node; and
wherein a control electrode of the third transistor is coupled to the second node, wherein a first electrode of the third transistor is coupled to the first clock signal terminal, and wherein a second electrode of the third transistor is coupled to the first node.

3. The shift register according to claim 1, wherein the hold circuit comprises a first capacitor, a second capacitor, a third capacitor, a fourth transistor, and a fifth transistor;
wherein a first terminal of the first capacitor is coupled to the first node, and wherein a second terminal of the first capacitor is coupled to a second voltage terminal;
wherein a first terminal of the second capacitor is coupled to the second node, and wherein a second terminal of the second capacitor is coupled to the first output terminal;
wherein a first terminal of the third capacitor is coupled to the second node, and wherein a second terminal of the third capacitor is coupled to the second output terminal;
wherein a control electrode of the fourth transistor is coupled to the first node, wherein a first electrode of the fourth transistor is coupled to the second voltage terminal, and wherein a second electrode of the fourth transistor is coupled to a first electrode of the fifth transistor; and
wherein a control electrode of the fifth transistor is coupled to the second clock signal terminal, and wherein a second electrode of the fifth transistor is coupled to the second node.

4. The shift register according to claim 1, wherein the output selection circuit comprises a sixth transistor, a seventh transistor, an eighth transistor, and a ninth transistor;
wherein a. control electrode of the sixth transistor is coupled to a first selection signal, wherein a first electrode of the sixth transistor is coupled to the second node, and wherein a second electrode of the sixth transistor is coupled to the third node;
wherein a control electrode of the seventh transistor is coupled to a second selection signal, wherein a first electrode of the seventh transistor is coupled to a second voltage terminal, and wherein a second electrode of the seventh transistor is coupled to the third node;
wherein a control electrode of the eighth transistor is coupled to a third selection signal, wherein a first electrode of the eighth transistor is coupled to the second node, and wherein a second electrode of the eighth transistor is coupled to the fourth node; and
wherein a control electrode of the ninth transistor is coupled to a fourth selection signal, wherein a first electrode of the ninth transistor is coupled to the second voltage terminal, and wherein a second electrode of the ninth transistor is coupled to the fourth node.

5. The shift register according to claim 1, wherein the first output circuit comprises a tenth transistor and an eleventh transistor;
wherein a control electrode of the tenth transistor is coupled to the first node, wherein a first electrode of the tenth transistor is coupled to a second voltage terminal, and wherein a second electrode of the tenth transistor is coupled to the first output terminal; and
wherein a control electrode of the eleventh transistor is coupled to the third node, wherein a first electrode of the eleventh transistor is coupled to the second clock signal terminal, and wherein a second electrode of the eleventh transistor is coupled to the first output terminal.

6. The shift register according to claim 1, wherein the second output circuit comprises a twelfth transistor and a thirteenth transistor;

wherein a control electrode of the twelfth transistor is coupled to the first node, wherein a first electrode of the twelfth transistor is coupled to a second voltage terminal, and wherein a second electrode of the twelfth transistor is coupled to the second output terminal; and wherein a control electrode of the thirteenth transistor is coupled to the fourth node, wherein a first electrode of the thirteenth transistor is coupled to the second clock signal terminal, and wherein a second electrode of the thirteenth transistor is coupled to the second output terminal.

7. The shift register according to claim 1, wherein the third output circuit comprises a fourteenth transistor and a fifteenth transistor;

wherein a control electrode of the fourteenth transistor is coupled to the second clock signal terminal, wherein a first electrode of the fourteenth transistor is coupled to the second node, and wherein a second electrode of the fourteenth transistor is coupled to the third output terminal; and wherein a control electrode of the fifteenth transistor is coupled to the second node, wherein a first electrode of the fifteenth transistor is coupled to the second clock signal terminal, and wherein a second electrode of the fifteenth transistor is coupled to the third output terminal.

8. The shift register according to claim 1, wherein a duty ratio of the first clock signal is greater than 1/2, and a phase difference between the second clock signal and the first clock signal is equal to half of a cycle.

9. A drive method for driving the shift register according to claim 1, the method comprising:

in the first phase, providing the start signal to the second node based on the first clock signal, providing the first voltage to the first node based on the first clock signal so as to provide a second voltage to the first output terminal and the second output terminal, and providing the second clock signal to the third output terminal based on the voltage of the second node;

in the second phase, holding the voltage of the second node by the hold circuit, providing the first clock signal to the first node based on the voltage of the second node, providing the voltage of the second node to at least one of the third node and the fourth node, so as to output at least one scanning signal from at least one of the first output circuit and the second output circuit based on the voltage of the third node and the voltage of the fourth node, and providing the second clock signal to the third output terminal based on the voltage of the second node;

in the third phase, providing the first voltage to the first node based on the first clock signal so as to provide the second voltage to the first output terminal and the second output terminal; and in the fourth phase, holding the voltage of the first node and the voltage of the second node so as to provide the second voltage to the first output terminal and the second output terminal.

10. The drive method according to claim 9, wherein in the second phase, the second clock signal is outputted from the first output circuit in the case of the first circuit being turned on based on the voltage of the third node, and wherein the output of the first output circuit is held by the hold circuit in the case of the first output circuit being turned off based on the voltage of the third node.

11. The drive method according to claim 9, wherein in the second phase, the second clock signal is outputted from the second output circuit in the case of the second output circuit being turned on based on the voltage of the fourth node, and wherein the output of the second output circuit is held by the hold circuit in the case of the second output circuit being turned off based on the voltage of the fourth node.

12. A gate drive device comprising a plurality of cascaded shift registers according to claim 1;

wherein the input terminal of a first-stage shift register is inputted with a scan enable signal; and wherein the input terminal of each of the shift registers at stages other than the first stage is coupled to the third output terminal of a previous-stage shift register, wherein the first clock signal terminal of each of the shift registers at stages other than the first stage is coupled to the second clock signal terminal of the previous-stage shift register, and wherein the second clock signal terminal of each of the shift registers at stages other than the first stage is coupled to the first clock signal terminal of the previous-stage shift register.

13. An array substrate comprising the gate drive device according to claim 12.

14. A display device comprising the array substrate according to claim 13.

15. The shift register according to claim 2, wherein the hold circuit comprises a first capacitor, a second capacitor, a third capacitor, a fourth transistor, and a fifth transistor;

wherein a first terminal of the first capacitor is coupled to the first node, and wherein a second terminal of the first capacitor is coupled to a second voltage terminal;

wherein a first terminal of the second capacitor is coupled to the second node, and wherein a second terminal of the second capacitor is coupled to the first output terminal;

wherein a first terminal of the third capacitor is coupled to the second node, and wherein a second terminal of the third capacitor is coupled to the second output terminal;

wherein a control electrode of the fourth transistor is coupled to the first node, wherein a first electrode of the fourth transistor is coupled to the second voltage terminal, and wherein a second electrode of the fourth transistor is coupled to a first electrode of the fifth transistor; and wherein a control electrode of the fifth transistor is coupled to the second clock signal terminal, and wherein a second electrode of the fifth transistor is coupled to the second node.

16. The shift register according to claim 15, wherein the output selection circuit comprises a sixth transistor, a seventh transistor, an eighth transistor, and a ninth transistor;

wherein a control electrode of the sixth transistor is coupled to a first selection signal, wherein a first electrode of the sixth transistor is coupled to the second node, and wherein a second electrode of the sixth transistor is coupled to the third node;

wherein a control electrode of the seventh transistor is coupled to a second selection signal, wherein a first electrode of the seventh transistor is coupled to the second voltage terminal, and wherein a second electrode of the seventh transistor is coupled to the third node;

wherein a control electrode of the eighth transistor is coupled to a third selection signal, wherein a first electrode of the eighth transistor is coupled to the second node, and wherein a second electrode of the eighth transistor is coupled to the fourth node; and wherein a control electrode of the ninth transistor is coupled to a fourth selection signal, wherein a first electrode of the ninth transistor is coupled to the second voltage terminal, and wherein a second electrode of the ninth transistor is coupled to the fourth node.

17. The shift register according to claim 16, wherein the first output circuit comprises a tenth transistor and an eleventh transistor;
   wherein a control electrode of the tenth transistor is coupled to the first node, wherein a first electrode of the tenth transistor is coupled to the second voltage terminal, and wherein a second electrode of the tenth transistor is coupled to the first output terminal; and
   wherein a control electrode of the eleventh transistor is coupled to the third node, wherein a first electrode of the eleventh transistor is coupled to the second clock signal terminal, and wherein a second electrode of the eleventh transistor is coupled to the first output terminal.

18. The shift register according to claim 17, wherein the second output circuit comprises a twelfth transistor and a thirteenth transistor;
   wherein a control electrode of the twelfth transistor is coupled to the first node, wherein a first electrode of the twelfth transistor is coupled to the second voltage terminal, and wherein a second electrode of the twelfth transistor is coupled to the second output terminal; and
   wherein a control electrode of the thirteenth transistor is coupled to the fourth node, wherein a first electrode of the thirteenth transistor is coupled to the second clock signal terminal, and wherein a second electrode of the thirteenth transistor is coupled to the second output terminal.

19. The shift register according to claim 18, wherein the third output circuit comprises a fourteenth transistor and a fifteenth transistor;
   wherein a control electrode of the fourteenth transistor is coupled to the second clock signal terminal, wherein a first electrode of the fourteenth transistor is coupled to the second node, and wherein a second electrode of the fourteenth transistor is coupled to the third output terminal; and
   wherein a control electrode of the fifteenth transistor is coupled to the second node, wherein a first electrode of the fifteenth transistor is coupled to the second clock signal terminal, and wherein a second electrode of the fifteenth transistor is coupled to the third output terminal.

20. The shift register according to claim 19, wherein a duty ratio of the first clock signal is greater than 1/2, and a phase difference between the second clock signal and the first clock signal is equal to half of a cycle.

* * * * *

UNITED STATES PATENT AND TRADEMARK OFFICE
CERTIFICATE OF CORRECTION

PATENT NO. : 10,490,150 B2  
APPLICATION NO. : 15/759420  
DATED : November 26, 2019  
INVENTOR(S) : Zhanjie Ma Page 1 of 1

It is certified that error appears in the above-identified patent and that said Letters Patent is hereby corrected as shown below:

In the Claims

In Claim 4, Column 16, Line 30, delete "wherein a. control" and insert therefor -- wherein a control --.

Signed and Sealed this
Tenth Day of March, 2020

Andrei Iancu
*Director of the United States Patent and Trademark Office*